United States Patent
Watanabe et al.

(10) Patent No.: US 7,952,172 B2
(45) Date of Patent: May 31, 2011

(54) SEMICONDUCTOR OPTICAL ELEMENT

(75) Inventors: Sawaki Watanabe, Tokyo (JP);
Kazuhiro Shiba, Tokyo (JP); Takeshi Nakata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/095,031

(22) PCT Filed: Dec. 20, 2006

(86) PCT No.: PCT/JP2006/325398
§ 371 (c)(1),
(2), (4) Date: May 27, 2008

(87) PCT Pub. No.: WO2007/077740
PCT Pub. Date: Jul. 12, 2007

(65) Prior Publication Data
US 2009/0160033 A1    Jun. 25, 2009

(30) Foreign Application Priority Data
Dec. 26, 2005 (JP) ................. 2005-372366

(51) Int. Cl.
H01L 29/06 (2006.01)
(52) U.S. Cl. ........ 257/623; 257/170; 257/618; 257/431; 257/432; 257/435; 257/E29.186; 257/E29.329; 257/E21.377; 257/E31.121; 438/48; 438/64; 438/69; 438/70; 349/56; 349/84; 349/122; 349/123
(58) Field of Classification Search ................ 257/95, 257/116, 189, 186, 199, 200, 481, 551, 603, 257/E21.365, E33.023, E33.037, E33.049, 257/E31.019, E31.026, E21.085, E21.086, 257/E21.126, E21.127, E27.012, E29.089, 257/E29.129, E29.145, E29.249, E29.196, 170, 452, 466, 496, 571, 586, 600, 618, 623, 624, 7, 187, E39.186, E29.329, E21.377, 431, 432, 435, 436, 184; 438/604, 48, 39, 41, 164, 319, 412, 570, 343, 978, 64, 65, 69, 70; 349/56, 84, 122, 123

See application file for complete search history.

(56) References Cited

U.S. PATENT DOCUMENTS
5,748,661 A * 5/1998 Kiely et al. ................. 372/50.1
(Continued)

FOREIGN PATENT DOCUMENTS
CN    1377107    10/2002
(Continued)

OTHER PUBLICATIONS
European Patent Office issued an European Search Report dated Jan. 21, 2010, Application No. 06842952.1.
(Continued)

Primary Examiner — Lynne A Gurley
Assistant Examiner — Yosef Gebreyesus
(74) Attorney, Agent, or Firm — Young & Thompson

(57) ABSTRACT

A light receiving element 1 has a semiconductor substrate 101; a first mesa 11 provided over the semiconductor substrate 101, and having an active region and a first electrode (p-side electrode 111) provided over the active region; a second mesa 12 provided over the semiconductor substrate 101, and having a semiconductor layer and a second electrode (n-side electrode 121) provided over the semiconductor layer; and a third mesa 13 provided over the semiconductor substrate 101, and having a semiconductor layer, wherein the third mesa 13 is arranged so as to surround the first mesa 11.

20 Claims, 18 Drawing Sheets

U.S. PATENT DOCUMENTS

| | | | |
|---|---|---|---|
| 5,796,714 | A | 8/1998 | Chino et al. |
| 6,184,066 | B1 | 2/2001 | Chino et al. |
| 6,535,537 | B1 * | 3/2003 | Kinoshita ............... 372/50.11 |
| 6,678,307 | B2 * | 1/2004 | Ezaki et al. ............... 372/96 |
| 6,790,697 | B2 * | 9/2004 | Kobayashi et al. ............ 438/44 |
| 7,462,889 | B2 * | 12/2008 | Yagyu et al. ............... 257/186 |
| 2002/0011640 | A1 | 1/2002 | Bauer et al. |
| 2004/0159836 | A1 * | 8/2004 | Sugimoto et al. ............ 257/40 |
| 2004/0238743 | A1 | 12/2004 | Gravrand et al. |
| 2004/0264541 | A1 * | 12/2004 | Wang et al. ............... 372/99 |
| 2005/0051784 | A1 * | 3/2005 | Niigaki et al. ............. 257/95 |
| 2005/0169336 | A1 * | 8/2005 | Ishii et al. ............... 372/50 |
| 2006/0038191 | A1 * | 2/2006 | Onishi et al. ............. 257/96 |

FOREIGN PATENT DOCUMENTS

| | | |
|---|---|---|
| JP | 8-153935 | 6/1996 |
| JP | 10-335383 | 12/1998 |
| JP | 11-266058 | 9/1999 |
| JP | 2000-332287 | 11/2000 |
| JP | 2000-349113 | 12/2000 |
| JP | 2001-298211 | 10/2001 |
| JP | 2002-368334 | 12/2002 |
| JP | 2003-110196 | 11/2003 |
| JP | 2004-319553 | 11/2004 |
| JP | 2005-277057 | 10/2005 |
| JP | 2005-328036 | 11/2005 |

OTHER PUBLICATIONS

Chinese Office Action dated Jan. 19, 2011 in corresponding Chinese Application No. 200680044080.4 with English translation of Chinese Office Action.

* cited by examiner

FIG. 12
(A)
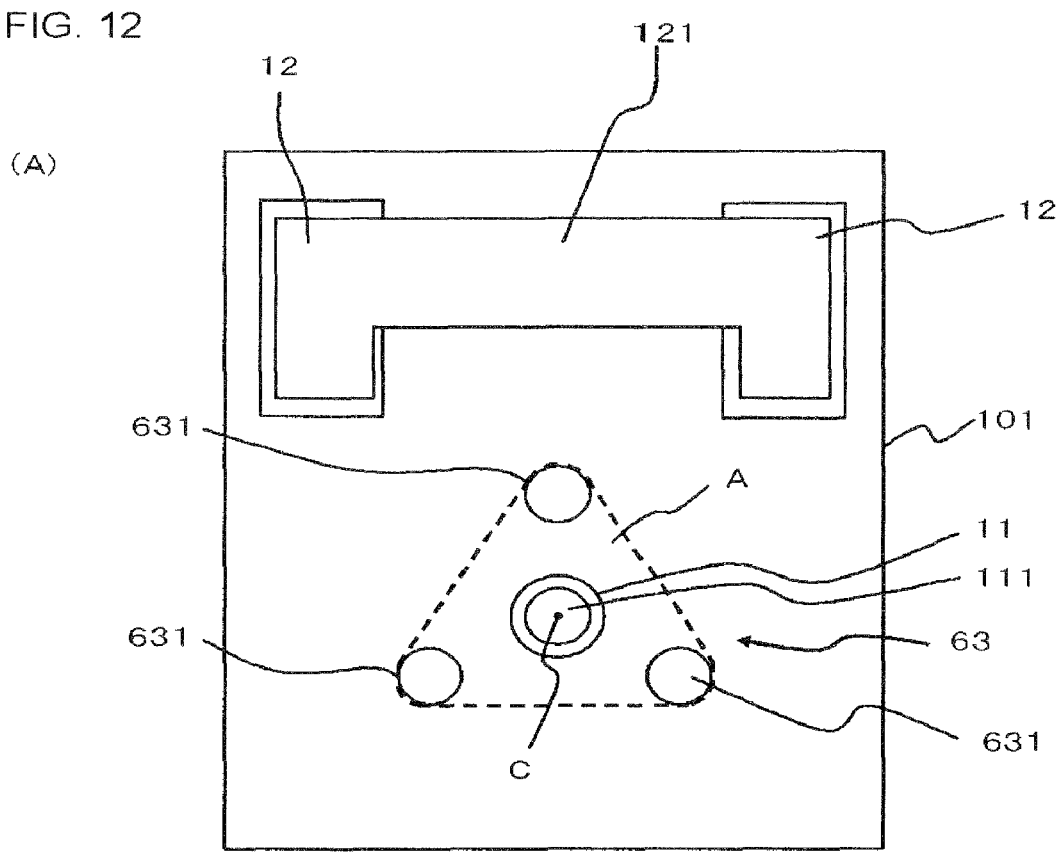
(B)
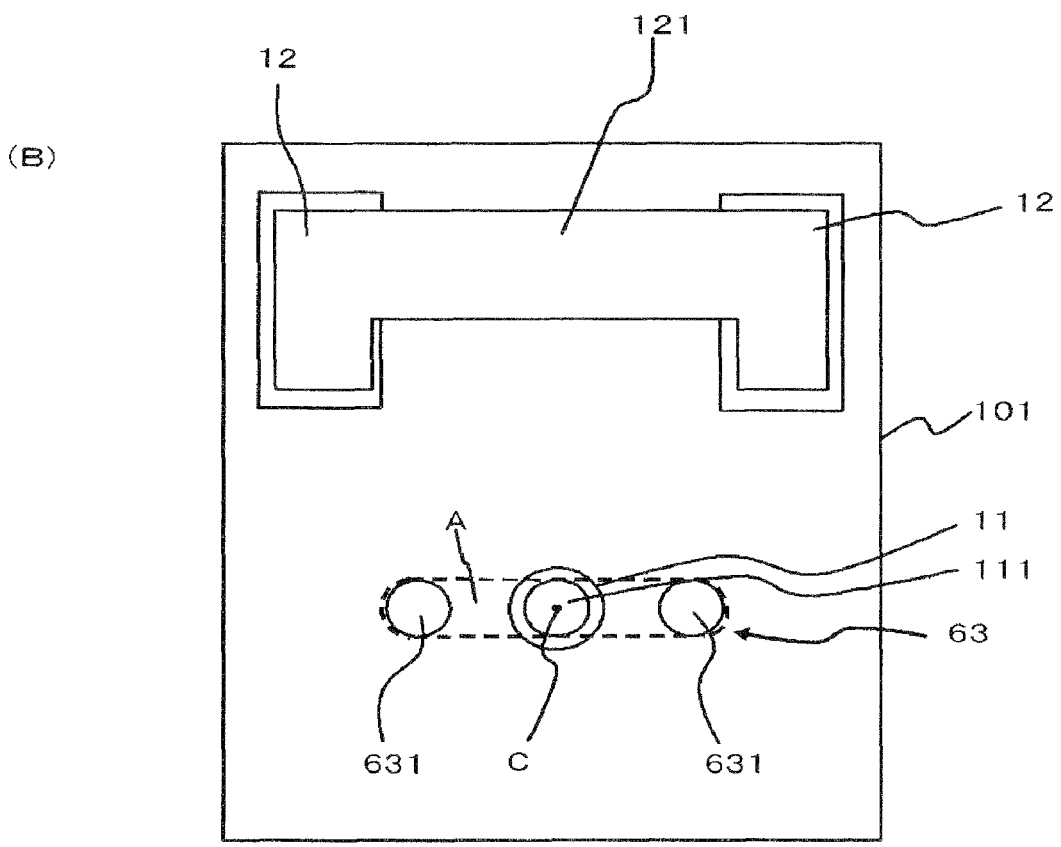

(B)

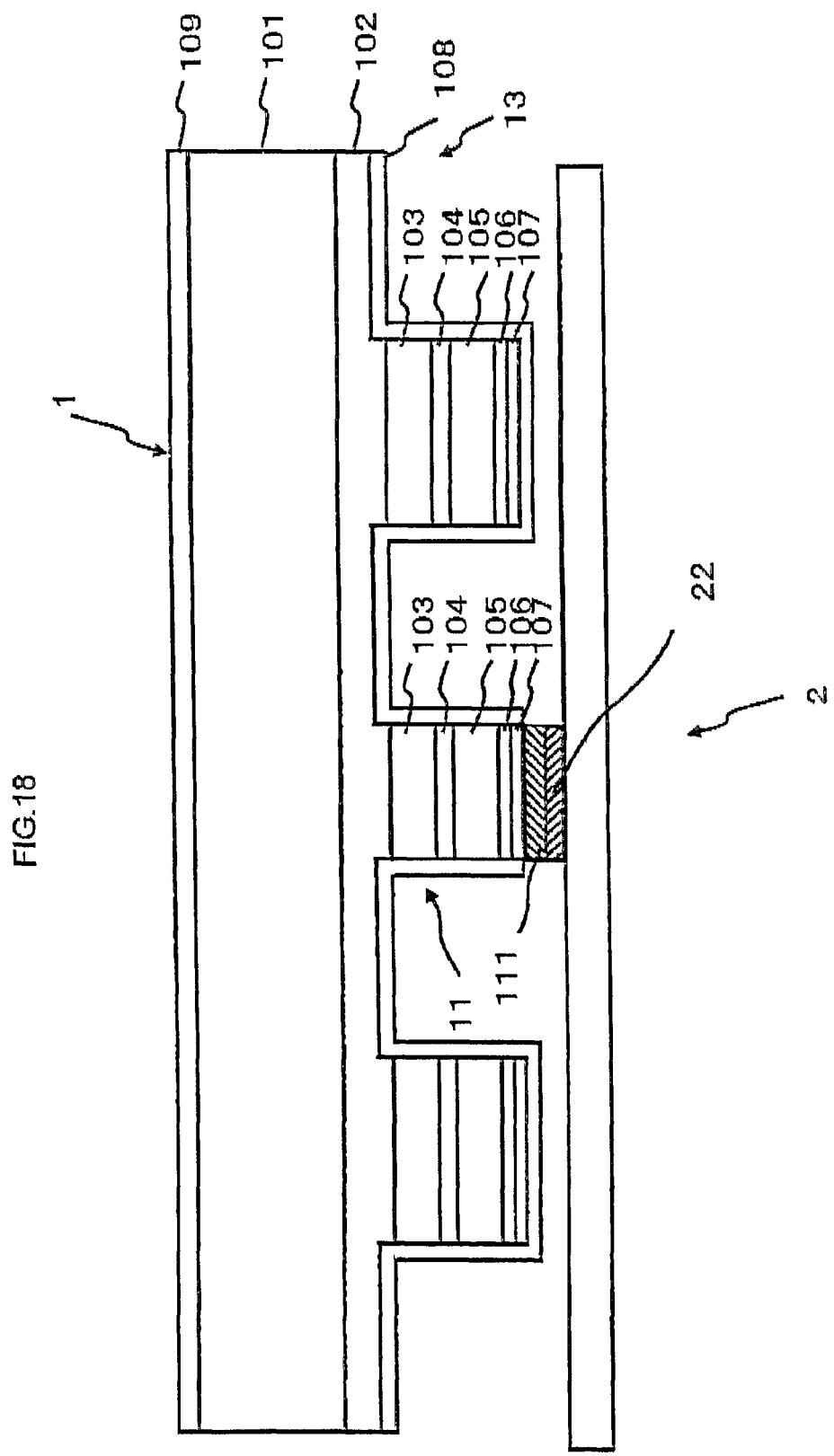

SEMICONDUCTOR OPTICAL ELEMENT

TECHNICAL FIELD

The present invention relates to a semiconductor optical element.

BACKGROUND ART

With explosive increase in needs of wide-band multi media communication service such as the Internet, there has been an expectation on development of an optical fiber communication system having a large capacity and advanced functions. The number of optical communication modules used for such large-sized system has steadily been increasing with megasizing of the system, so that cost and load of mounting, as well as size of the optical communication modules, have become no more ignorable relative to the entire system. Therefore, downsizing of the optical communication modules per se, integration of functions, and cost reduction are understood as being most critical subjects.

In particular, hybrid optical integrated module, having semiconductor optical elements mounted by flip-chip bonding onto a platform having an optical waveguide circuit preliminarily formed thereon, is strongly expected as an optical integration technology closest to the practical use, typically in terms of productivity.

The flip-chip bonding may get rid of a step of wire bonding, in the process of connecting a semiconductor optical element with an external circuit. A method based on wire bonding has been suffering from a problem in that the bonded portion is likely to cause degradation or variation in dynamic characteristics, and also in that high-frequency signals are more susceptible due to inductance appears on the wire. The flip-chip bonding is, therefore, a particularly effective method of mounting semiconductor elements which operate at high frequencies.

The semiconductor optical element herein may be exemplified by a semiconductor optical element 800 as shown in FIG. 15 (see Patent Document 1). The semiconductor optical element 800 has a substrate 801, and a buffer layer 802, a light absorbing layer 803, and a cap layer 804 stacked over the substrate 801. The semiconductor optical element 800 has a mesa-shaped light receiving portion 805, and a mesa-shaped pad electrode forming portion 806. The mesa-shaped light receiving portion 805 has a p-side contact electrode 805A formed on the light receiving zone thereof, and has an n-side contact electrode 805B on the zone other than the light receiving zone of the light receiving portion 805. The pad electrode forming portion 806 has a p-side electrode 806A formed therein.

The p-side contact electrode 805A and the p-side electrode 806A are connected through an interconnect 805A1. On the n-side contact electrode 805B, an n-side electrode 805B1 is formed.

In the semiconductor optical element 800, the n-side electrode 805B1, and the interconnect 805A1 connected to the p-side electrode 806A are formed on the same mesa-shaped light receiving portion 805, wherein the interconnect 805A1 is formed in a ring shape, and the n-side electrode 805B1 has an arc portion conforming to the ring-shaped interconnect 805A1.

When the semiconductor optical element 800 is mounted by flip-chip bonding, solder coated on the n-side electrode 805B1 may flow over the interconnect 805A1 connected to the p-side electrode 806A, to thereby shortcircuit the n-side electrode 805B1 and the p-side electrode 806A.

Thus-configured semiconductor optical element 800 is, therefore, generally believed as being unsuitable for flip-chip bonding.

Alternatively, a semiconductor optical element 900 configured as shown in FIG. 16 has been proposed (see Patent Document 2, for example).

The semiconductor optical element 900 has a semiconductor substrate 904, a low concentration p-type layer 905, a high concentration p-type layer 906, a light absorbing layer 907, a low concentration n-type layer 908, an n-type cap layer 909, and a n-type contact layer 910.

The semiconductor optical element 900 has a p-side electrode forming mesa 901 having a p-side electrode 901A formed on the top thereof, a light receiving mesa 902 having the light absorbing layer 907, and also having an n-side electrode 902A formed on the top thereof, and an n-side electrode forming mesa 903 having an n-side electrode 903A formed on the top thereof. The n-side electrode 903A is connected to the n-side electrode 902A.

In the semiconductor optical element 900, the individual mesas 901 to 903 are independently formed, so as to make the p-side electrode 901A and the n-side electrode 903A less likely to cause short-circuiting when the element is mounted by flip-chip bonding.

[Patent Document 1]
Japanese Laid-Open Patent Publication No. 2001-298211
[Patent Document 2]
Japanese Laid-Open Patent Publication No. 2003-332287

DISCLOSURE OF THE INVENTION

Problems to be Solved by the Invention

However, the prior art described in Patent Document 2 still has a room for improvement in terms of the following points.

Independent formation of the p-side electrode forming mesa 901, the n-side electrode forming mesa 903 and the light receiving mesa 902 will be more likely to apply larger load to each mesa, than in the conventional technology described in Patent Document 1.

In particular, the light receiving mesa 902 has the light absorbing layer 907 formed therein as an active region under the n-side electrode 902A, so that pressure applied to the active region may adversely affect performances of the semiconductor optical element 900.

For example, the light receiving mesa 902 may be applied with concentrated force and performances of the semiconductor optical element 900 may adversely be affected, typically when a substrate for mounting is disposed as being inclined from this side towards the further side in FIG. 16, with respect to the semiconductor substrate 904 of the semiconductor optical element 900, or when the p-side electrode 901A is varied in thickness, thereby height of the p-side electrode forming mesa 901 becomes lower than height of the light receiving mesa 902, and the substrate for mounting is consequently disposed as being inclined towards the p-side electrode forming mesa 901.

Means for Solving the Problems

The present inventors found out the above-described subjects of degradation in performances of the semiconductor optical element ascribable to load applied to the active region, which have not been recognized in Patent Document 2 described in the above, and proposed a semiconductor optical element configured as described below, aiming at solving the subjects.

According to the present invention, there is provided a semiconductor optical element having a semiconductor substrate; a first mesa provided over the semiconductor substrate, and having an active region and a first electrode provided over the active region; a second mesa provided over the semiconductor substrate, and having a semiconductor layer and a second electrode provided over the semiconductor layer; and a third mesa provided over the semiconductor substrate, and having a semiconductor layer, wherein the third mesa is arranged so as to surround the first mesa.

The expression of "the third mesa is arranged so as to surround the first mesa" herein means that the third mesa may have a seamless ring shape, or may have a slit in a part of the ring. Alternatively, the third mesa may have a plurality of mesa components, and such plurality of mesa components may be arranged so as to surround the first mesa.

The first mesa may be good enough if the center thereof falls in the region surrounded by the third mesa in a plan view.

The height-wise dimension of the third mesa is not specifically limited, and may be same with that of the first mesa, or may have the height-wise dimension different from that of the first mesa.

According to the present invention as described in the above, having the third mesa arranged as surrounding the first mesa, concentration of pressure to the first mesa may be moderated, because the third mesa will be brought into contact with the substrate for mounting, even if the substrate for mounting, on which the semiconductor optical element is mounted, should be arranged as being inclined in various directions.

As a consequence, performances of the semiconductor optical element may be prevented from being degraded.

Effect of the Invention

According to the present invention, there is provided a semiconductor optical element capable of preventing the performances from degrading.

BRIEF DESCRIPTION OF THE DRAWINGS

The above and other objects, features and advantages of the present invention will be more apparent from the following description of certain preferred embodiments and the accompanying drawings.

FIG. 12 is a plan view showing a modified example of the present invention;

FIGS. 17-18 are sectional views showing the semiconductor optical element mounted face-down on a substrate for mounting so that the tops of the first, second and third mesas are facing towards the substrate for mounting.

BEST MODE FOR CARRYING OUT THE INVENTION

Figure 1:
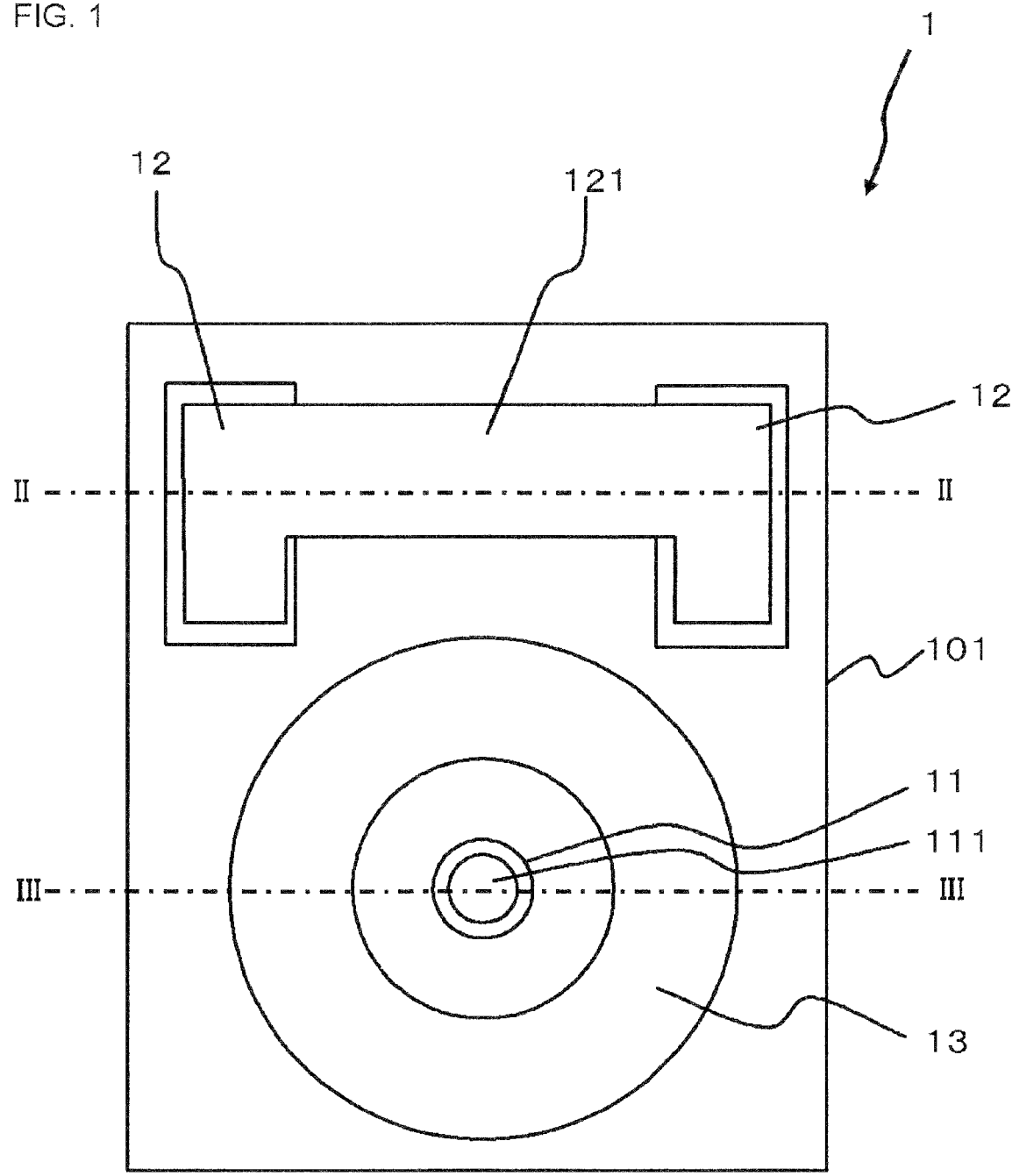
FIG. 1 is a plan view showing a light receiving element according to a first embodiment of the present invention.

Embodiments of the present invention will be explained below, referring to the attached drawings. In all drawings, any similar constituents will be given with same reference numerals, and explanation will not be repeated for convenience' sake.

First Embodiment

Figure 2:
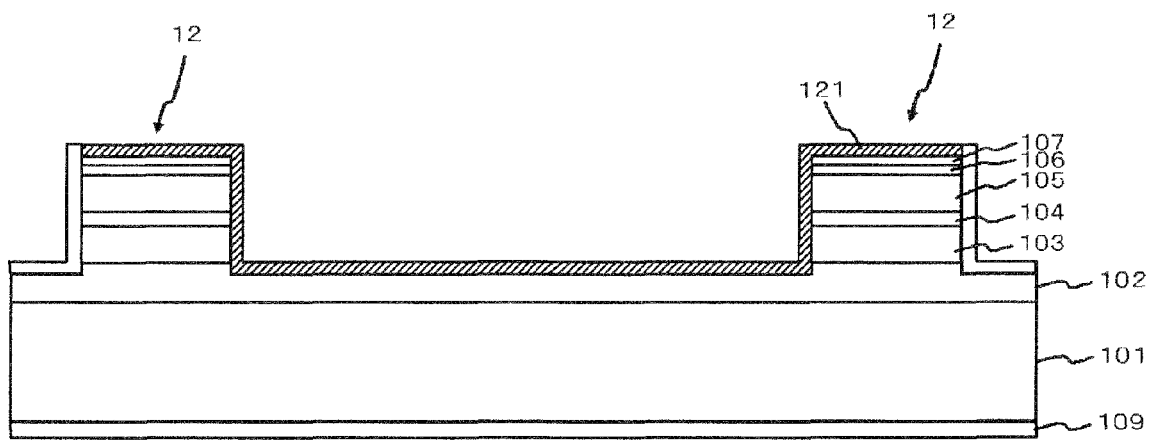
FIG. 2 is a sectional view taken along direction II-II in FIG. 1.
Figure 3:
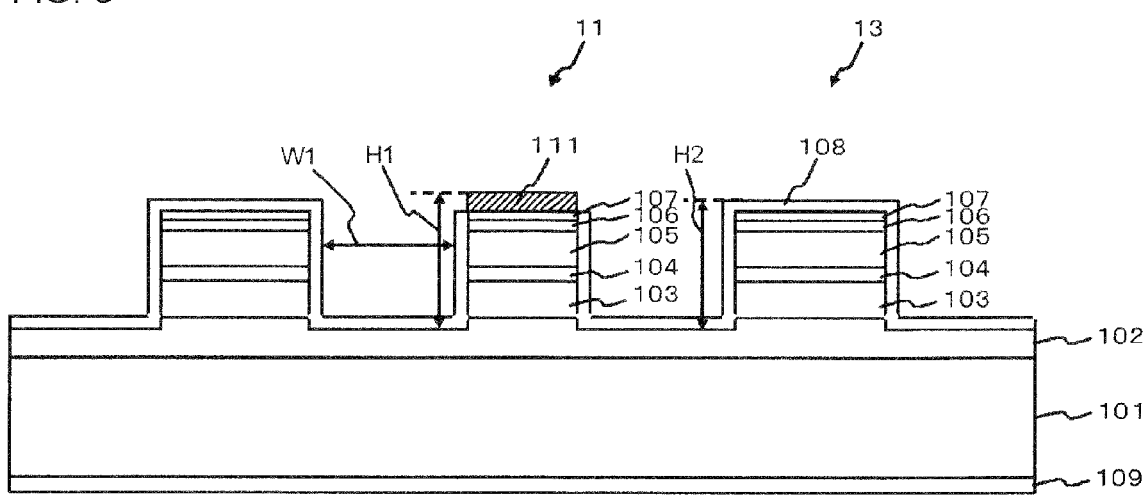
FIG. 3 is a sectional view taken along direction III-III in FIG. 1.

In FIG. 1 to FIG. 3, a semiconductor optical element is shown. In this embodiment, the semiconductor optical element is a semiconductor light receiving element 1. FIG. 1 is a plan view of the light receiving element 1, and FIG. 2 is a sectional view taken along direction II-II in FIG. 1. FIG. 3 is a sectional view taken along direction III-III in FIG. 1.

First, an outline of the light receiving element 1 will be explained.

The light receiving element 1 has a semiconductor substrate 101, a first mesa 11 provided over the semiconductor substrate 101, and having an active region and a first electrode (p-side electrode 111) provided over the active region; second mesas 12 provided over the semiconductor substrate 101, and each having a semiconductor layer and a second electrode (n-side electrode 121) provided over the semiconductor layer; and a third mesa 13 provided over the semiconductor substrate 101, and having a semiconductor layer, wherein the third mesa 13 is arranged so as to surround the first mesa.

Details of the light receiving element 1 will be explained below.

The light receiving element 1 has the semiconductor substrate 101, and the semiconductor layers stacked on the semiconductor substrate 101.

The semiconductor substrate 101 is typically an InP substrate. On the back surface of the semiconductor substrate 101, an anti-reflective layer 109 is provided.

The semiconductor layer is obtained by stacking, as shown in FIG. 2, a buffer layer 102, a multiplier layer 103, an electric field moderating layer 104, a light absorbing layer (active region) 105, a cap layer 106, and a contact layer 107 in this order over the semiconductor substrate 101.

The buffer layer 102 is typically an n$^+$-type InP buffer layer.

The multiplier layer 103 induces avalanche multiplication upon being applied with high electric field, to thereby produce a large amount of carriers. The multiplier layer 103 is typically an undoped InAlAs layer.

The electric field moderating layer 104 is a layer provided in order to moderate difference between high electric field applied to the multiplier layer 103 and a relatively low electric field applied to the light absorbing layer 105.

By providing this layer, the multiplier layer 103 may now be applied with high electric field in a stable manner. The electric field moderating layer 104 may be exemplified by a p-type InP layer, InAlAs layer and so forth.

The light absorbing layer 105 is a layer playing a role of converting the incident light into electricity, and has a band gap capable of absorbing light to be received. The light absorbing layer 105 corresponds to an I layer, and is typically an undoped InGaAs layer.

The cap layer 106 is typically a $p^+$-type InP layer or InAlAs layer, and the contact layer 107 is typically a $p^+$-type InGaAs layer.

On the semiconductor substrate 101 of thus-configured light receiving element 1, a plurality of mesas (first mesa 11, second mesas 12, third mesa 13) having the layers 102 to 107 are formed. The individual mesas 11 to 13 are formed by stacking the individual layers 102 to 107 and then etching them, which will be detailed later.

The first mesa 11, the second mesas 12, and the third mesa 13 are independently provided while being spaced from each other and free of direct physical contact with each other.

As shown in FIG. 1 and FIG. 3, the first mesa 11 is formed in a near-cylindrical shape. The first mesa 11 has the individual layers 102 to 107, and the p-side electrode 111 provided over the contact layer 107. The light absorbing layer 105 in the first mesa 11 is an active region.

Width-wise dimension of the first mesa 11 (the width-wise dimension as viewed in the direction normal to the direction of projection of the first mesa 11, which is the diameter of the first mesa 11 herein) is 20 to 30 µm, for example.

The p-side electrode 111 is typically a stacked electrode containing Au.

As shown in FIG. 1 and FIG. 2, there are provided a plurality of (two in this embodiment) second mesas 12, each having a shape of rectangular prism.

The individual second mesas 12 are formed at positions a predetermined distance away from the first mesa 11.

Two these second mesas 12 are arranged in an opposed manner.

Over the contact layer 107 of each second mesa 12, and over the buffer layer 102 between the individual second mesas 12, the n-side electrode 121 is formed. The n-side electrode 121 is composed of a step-conforming interconnect. The n-side electrode 121 is again an Au-containing stacked electrode.

Area of the top of each second mesa 12 is larger than area of the top of the first mesa 11.

The second mesas 12 and the first mesa 11 are connected through the buffer layer 102 which is an electro-conductive layer.

As shown in FIG. 1 and FIG. 3, the third mesa 13 is formed in a ring shape so as to surround the first mesa 11.

The third mesa 13 completely surrounds the periphery of the first mesa 11 in a seamless and continuous manner. A part of the third mesa 13 falls between the first mesa 11 and the second mesas 12.

Distance W1 between the third mesa 13 and the first mesa 11 is preferably adjusted to 20 to 30 µm. The third mesa 13 in this embodiment is formed in an annular shape, but the shape is not limited thereto. For example, the third mesa may be formed in a square frame shape.

The top and side walls of the third mesa 13, the surface of the buffer layer 102 in the periphery of the mesas 11 to 13, the sidewall of the first mesa 11, and the sidewalls of the second mesas 12 has a protective film 108 formed thereon. The protective film 108 is an insulating film, and typically a silicon nitride film.

The height-wise dimensions of the first mesa 11 and the second mesas 12 are nearly equal. The height-wise dimension H2 of the third mesa 13 is slightly smaller than the height-wise dimension H1 of the first mesa 11, due to absence of electrode on the top thereof.

In thus-configured light receiving element 1, light is introduced from the back surface side of the semiconductor substrate 101, the incident light is absorbed by the light absorbing layer 105, and therein electron-hole pairs are produced as carriers.

The holes move through the cap layer 106 and the contact layer 107 to reach the p-side electrode 111, whereas electrons move through the buffer layer 102 to reach the n-side electrode 121.

Figure 4:
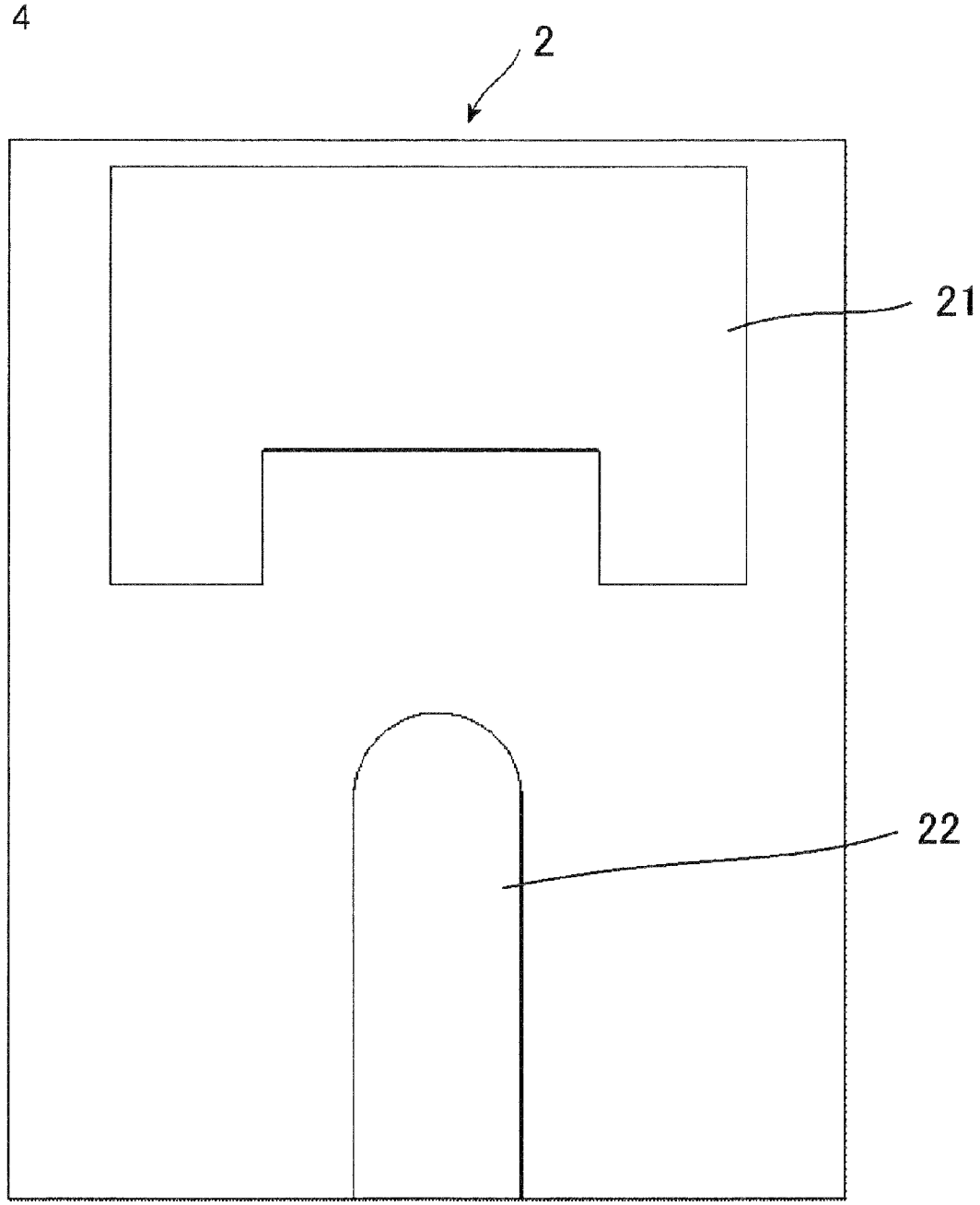
FIG. 4 is a plan view showing a substrate for mounting.

The light receiving element 1 herein may be mounted on a substrate for mounting 2 shown in FIG. 4.

The substrate for mounting 2 is composed of an insulating material, and has electrodes 21, 22 corresponded to the n-side electrode 121 and the p-side electrode 111 of the light receiving element 1, formed on the surface thereof. The electrode 21 corresponded to the n-side electrode 121 has a near-C shape in the plan view, and the electrode 22 corresponded to the p-side electrode 111 lies in an extended manner.

Figure 17:
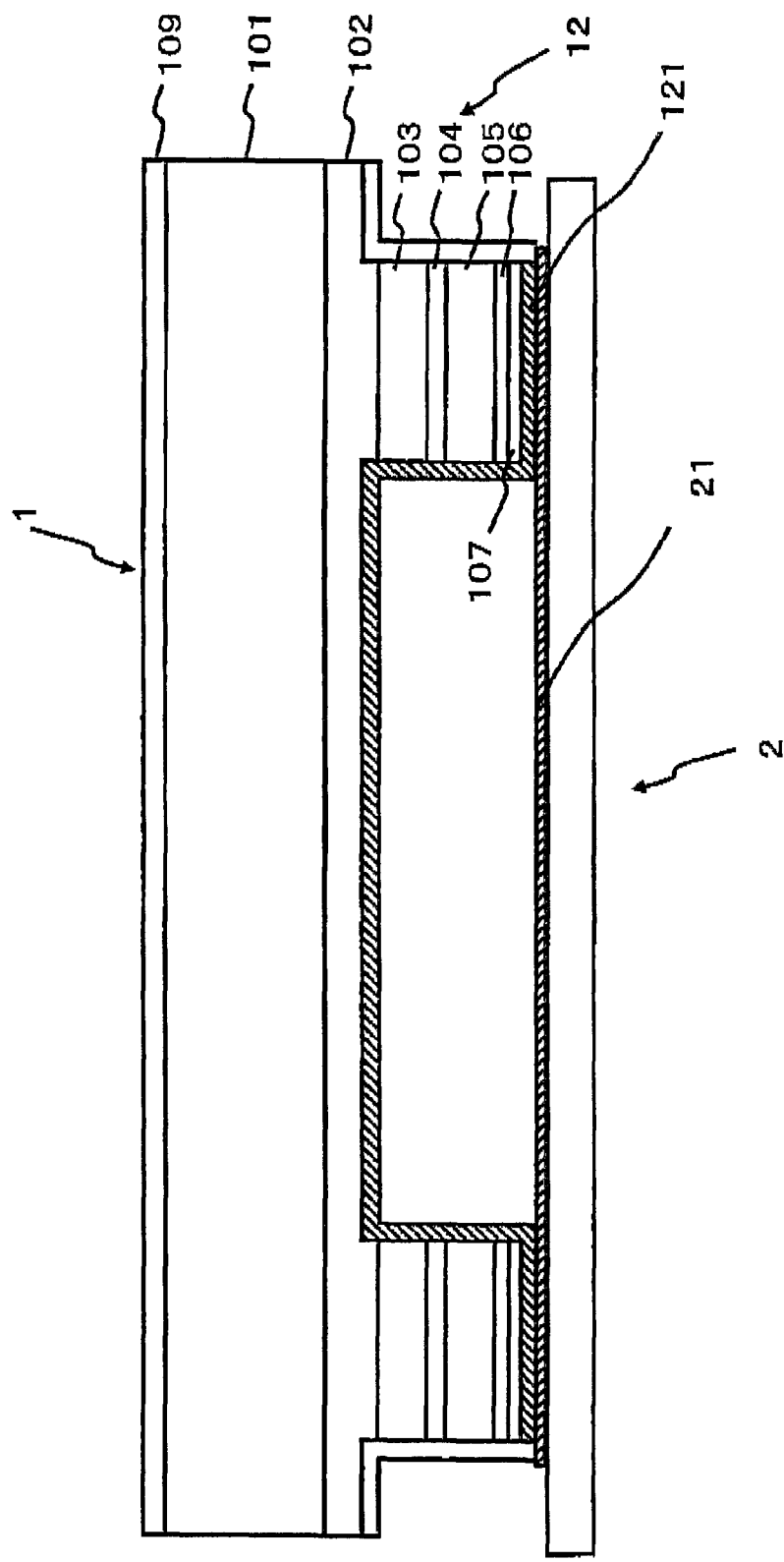

Solder or the like is coated on each of thus-configured electrodes 21, 22 of the substrate for mounting 2, and the light receiving element 1 is disposed in a face-down manner, while directing the tops of the individual mesas 11 to 13 towards the substrate for mounting 2, so as to make the n-side electrode 121 and the p-side electrode 111 of the light receiving element 1 opposed to the electrodes 21, 22, respectively. The light receiving element 1 may be mounted on the substrate for mounting 2 in this way. See FIGS. 17-18.

Next, a method of manufacturing the light receiving element 1 will be explained.

First, over the semiconductor substrate 101, the buffer layer 102, the multiplier layer 103, the electric field moderating layer 104, the light absorbing layer 105, the cap layer 106, and the contact layer 107 are sequentially stacked by MBE (molecular beam epitaxy) using gas sources.

Next, the individual layers 102 to 107 are selectively removed by etching, to thereby form the first mesa 11, the second mesas 12, and the third mesa 13. The etching is continued until a part of the buffer layer 102 is etched off.

After completion of the etching, the height-wise dimensions of the first mesa 11, the second mesas 12, and the third mesa 13 are nearly equal.

Next, the protective film 108 is formed over the surface of the light receiving element 1. The protective film 108 is formed so as to cover the side walls and tops of the individual mesas 11 to 13, and also the buffer layer 102 exposed around the individual mesas 11 to 13.

Thereafter, the protective film 108 is selectively removed by etching in a portion thereof formed on the top of the first mesa 11, in portions formed on the tops of a pair of second mesas 12, and in a portion formed on the buffer layer between the pair of second mesas 12. An etching solution used herein is of hydrofluoric acid, for example.

Next, to the portions having the protective film 108 removed therefrom, the p-side electrode 111 and the n-side electrode 121 are respectively formed. More specifically, the p-side electrode 111 is formed over the top of the first mesa 11, and the n-side electrode 121 is formed over the tops of the second mesas 12 and over the buffer layer 102 between the pair of second mesas 12. The n-side electrode 121 is composed of a step-conforming interconnect.

Last of all, the back surface of the semiconductor substrate 101 is polished to a specular grade, and the anti-reflective film 109 is formed on the back surface.

The light receiving element 1 may be completed in this way.

Effects of this embodiment will be explained.

In this embodiment, the third mesa 13 formed in a ring shape completely surrounds the first mesa 11.

By virtue of this configuration, the third mesa 13 will be brought into contact with the substrate for mounting 2, and thereby the first mesa 11 may be prevented from being applied with force in a concentrated manner, even if the substrate for mounting 2 should be disposed as being inclined in various directions with respect to the semiconductor substrate 101 of the light receiving element 1, typically because the electrodes 21, 22 on the substrate for mounting 2 were not formed exactly as designed, and were therefore varied in height or inclined in the surface thereof, or because thickness of the n-side electrode 121 was out of a designed value.

In this embodiment, the third mesa 13 is formed in a seamless annular shape, so that the third mesa 13 will be brought into contact with the substrate for mounting 2, and thereby the first mesa 11 may reliably be prevented from being applied with force in a concentrated manner, even if the substrate for mounting 2 was disposed as being inclined in various direction with respect to the semiconductor substrate 101 of the light receiving element 1.

By virtue of this configuration, the light receiving element 1 may be prevented from being degraded in performance.

In this embodiment, the first mesa 11 may supposedly be weaker against pressure than the second mesas 12, because the area of the top of the first mesa 11 is smaller than the area of each second mesa 12.

This embodiment, having the third mesa 13 provided so as to surround the first mesa 11, may prevent the light receiving element 1 from being degraded in performance, more reliably as compared with the case where the third mesa is provided so as to surround the second mesas 12.

Because the third mesa 13 is formed in a ring shape so as to surround the first mesa 11, the third mesa 13 may prevent water from intruding into the area around the first mesa 11, when the light receiving element 1 is mounted on the substrate for mounting 2.

The sidewall of the first mesa 11 is covered by the protective film 108, wherein intrusion of water towards the first mesa 11 may be suppressed, even for the case where adherence between the protective film 108 and the sidewall of the first mesa is not so good.

By virtue of this configuration, long-term reliability of the light receiving element 1 may be ensured.

A gap may be formed between the substrate for mounting 2 and the top of the third mesa 13, because the height-wise dimension of the third mesa 13 is slightly lower than the height-wise dimension of the first mesa 11, but water may be prevented from intruding into the periphery of the first mesa 11 more reliably than in a semiconductor optical element having the first mesa not surrounded by the third mesa.

In this embodiment, a part of the third mesa 13 locates between the first mesa 11 and the second mesas 12. By virtue of this configuration, the creeping distance between the p-side electrode 111 at the top of the first mesa 11 and the n-side electrode 121 on the tops of the second mesas 12 may be elongated, and thereby leakage current may be prevented from generating.

Generation of leakage current may largely affect performances of the light receiving element 1, because electric current obtainable from the incident light is very weak. Prevention of leakage current as attainable by this embodiment may provide the light receiving element 1 having more advanced performances.

In this embodiment, the first mesa 11 has the p-side electrode 111 formed on the top thereof, wherein the p-side electrode 111 has only a small area, and thereby capacitance of a capacitor composed of the p-side electrode 111 and the n-side electrode 121 may be reduced. By virtue of this configuration, the light receiving element 1 will be made excellent in the response.

When the light receiving element 1 is manufactured, a plurality of the first mesas 11, the second mesas 12, and the third mesas 13 are formed on a single semiconductor substrate 101 to thereby form a plurality of light receiving elements 1 in an integrated manner, and then the semiconductor substrate 101 is diced to thereby separate the individual light receiving elements 1. In this process, the protective film 108 may be peeled as being originated from the surface produced by separation of the light receiving elements 1, whereas in this embodiment, the protective film 108 covering the sidewall of the first mesa 11 may be prevented from peeling, because the first mesa 11 is surrounded by the third mesa 13.

Second Embodiment

A second embodiment will be explained referring to FIG. 5 to FIG. 7.

Figure 5:
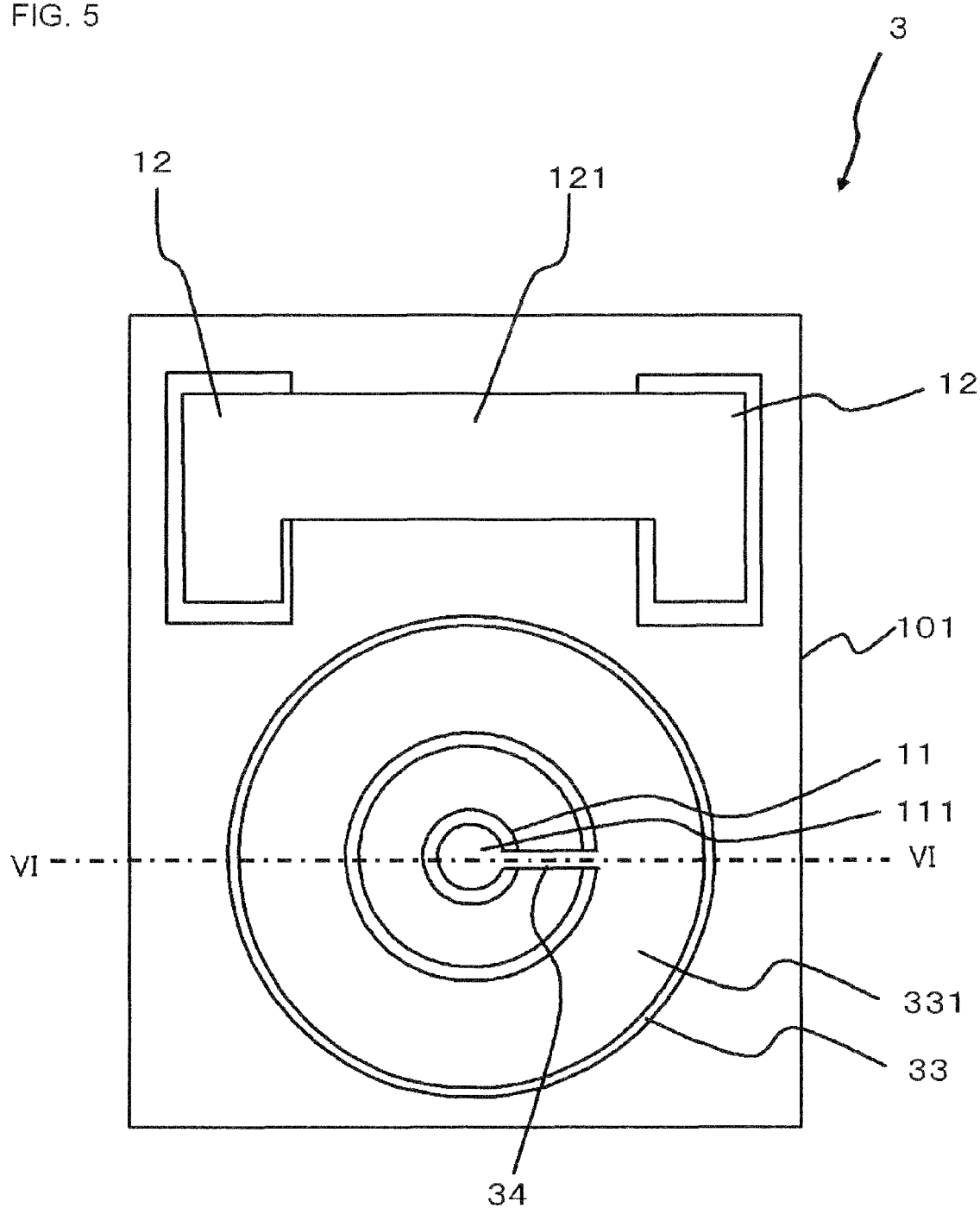
FIG. 5 is a plan view showing a light receiving element according to a second embodiment.
Figure 6:
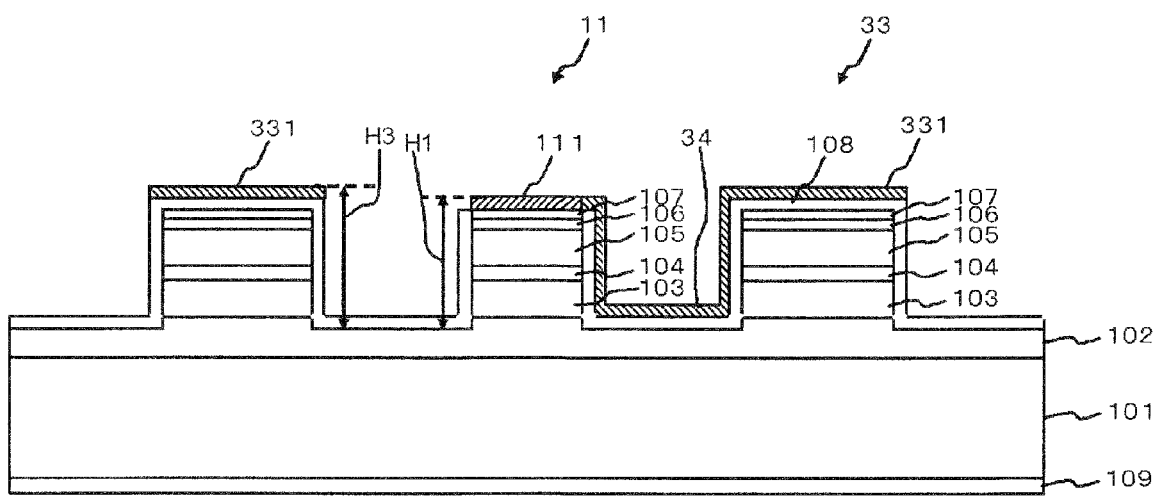
FIG. 6 is a sectional view taken along direction VI-VI in FIG. 5.

FIG. 5 is a plan view of a light receiving element 3, and FIG. 6 is a sectional view taken along direction VI-VI in FIG. 5. FIG. 7 is a plan view of a substrate for mounting 4 on which the light receiving element 3 is mounted.

As shown in FIG. 5 and FIG. 6, the light receiving element 3 of this embodiment is different from the first embodiment in that a third mesa 33 has an extractor electrode 331 formed on the top thereof, and in that an interconnect 34, connecting the p-side electrode 111 on the top of the first mesa 11 and the extractor electrode 331 on the top of the third mesa 33, is provided.

Other aspects are same as those in the first embodiment.

The light receiving element 3 will be detailed below.

The light receiving element 3 has the first mesa 11 and the second mesas 12 which are similar to those in the above-described embodiment. The light receiving element 3 has also a third mesa 33.

The third mesa 33 is configured almost similarly to the third mesa 13 in the above-described embodiment, but is different from the third mesa 13 in that it has the extractor electrode 331 formed on the top (on the protective film 108).

The extractor electrode 331 of the third mesa 33 herein is formed on the protective film 108, so that height-wise dimension H3 of the third mesa 33 is larger than height-wise dimension H1 of the first mesa 11.

The extractor electrode 331 on the top of the third mesa 33 and the p-side electrode 111 of the first mesa 11 is connected through an interconnect 34. The interconnect 34 is provided over the protective film 108 covering the side wall of the first mesa 11, over the protective film 108 on the buffer layer 102 between the first mesa 11 and the third mesa 33, and further over the protective film 108 covering the sidewall of the third mesa 33.

Figure 7:
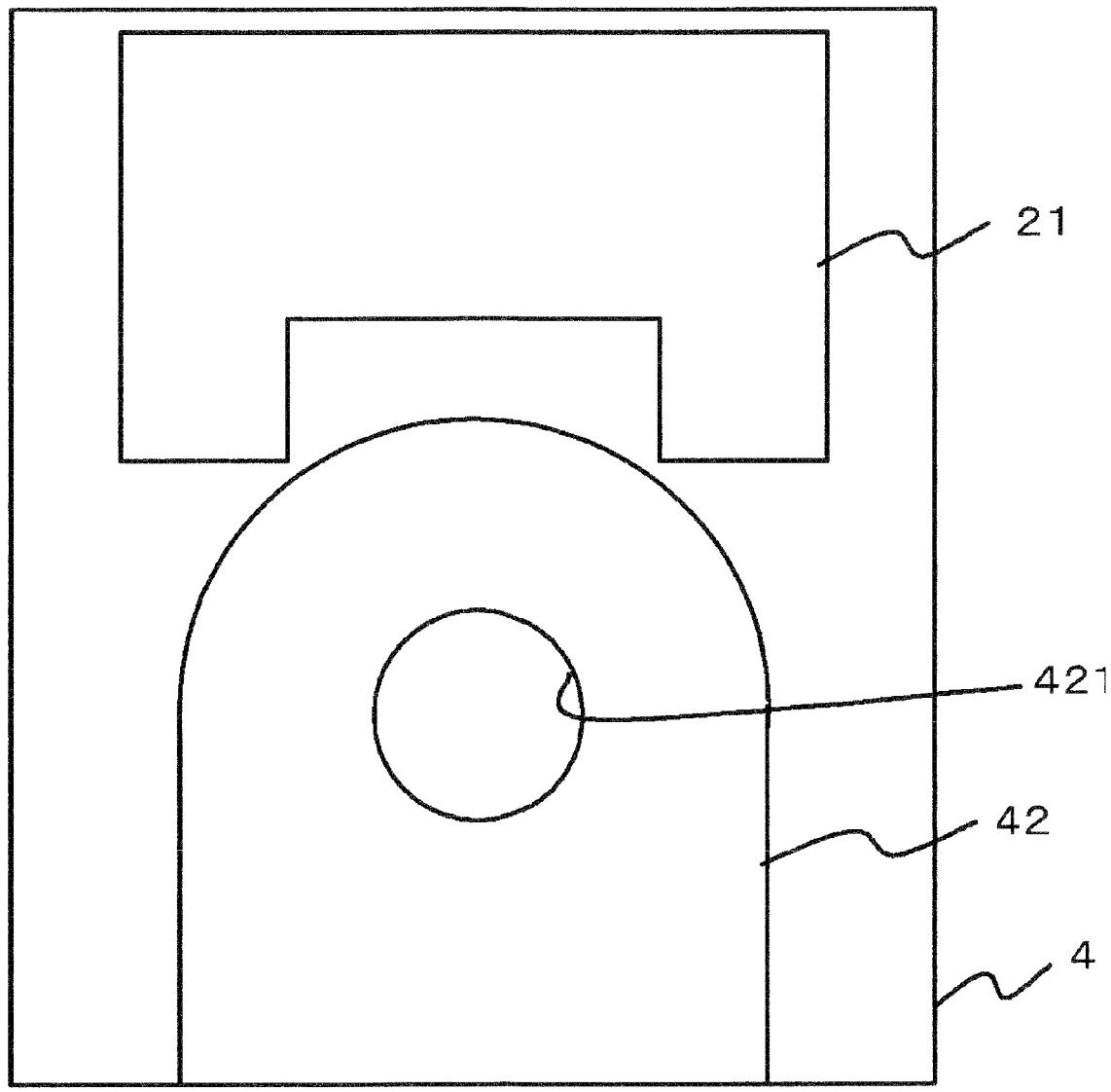
FIG. 7 is a plan view showing a substrate for mounting.

The light receiving element 3 described in the above may be mounted on a substrate for mounting 4 as shown in FIG. 7.

The substrate for mounting 4 is composed of an insulating material, and has electrodes 21, 42 corresponded to the n-side electrode 121 and the extractor electrode 331 of the light receiving element 3 respectively, formed on the surface thereof.

The electrode 21 corresponded to the n-side electrode 121 is formed in a near-C shape in the plan view, similarly to as on the substrate for mounting 2 in the foregoing embodiment.

On the other hand, the electrode 42 corresponded to the extractor electrode 331 has a hole 421 formed therein, so that the position corresponded to the p-side electrode 111 has no electrode 42 formed therein, allowing the insulating material to expose therein.

A recess may be formed at the position corresponded to the hole 421 of the insulating material.

When the light receiving element 3 is mounted on thus-configured substrate 4, a solder or the like is coated on the electrodes 21, 42 on the substrate for mounting 4. The tops of the mesas 11, 12, 33 of the light receiving element 3 are directed towards the substrate for mounting 4, and the electrode 21 and the n-side electrode 121 are bonded, and the electrode 42 and the extractor electrode 331 are bonded. The p-side electrode 111 herein is not brought into contact with the electrode 42.

In this way, the light receiving element 3 is mounted on the substrate 4.

Next, a method of manufacturing the light receiving element 3 will be explained.

First, similarly to as in the above-described embodiment, the buffer layer 102, the multiplier layer 103, the electric field moderating layer 104, the light absorbing layer 105, the cap layer 106, and the contact layer 107 are stacked over the semiconductor substrate 101, to thereby form the first mesa 11, the second mesas 12, and the third mesa 33.

Thereafter, the protective film 108 is stacked.

The protective film 108 is then selectively etched similarly to as in the above-described embodiment, and thereafter, the p-side electrode 111 and the n-side electrode 121 are formed.

When the p-side electrode 111 is formed, the extractor electrode 331 is formed over the contact layer 107 of the third mesa 33. More specifically, the interconnect 34 is drawn out from the p-side electrode 111, and the extractor electrode 331 is then formed.

According to this embodiment, not only the effects almost similar to those in the foregoing embodiment may be expressed, but also the effects below may be expressed.

In this embodiment, the extractor electrode 331 is formed on the top of the third mesa 33, so that the height-wise dimension of the third mesa 33 is larger than the height-wise dimension of the first mesa 11.

The electrode 42 of the substrate for mounting 4 is bonded with the extractor electrode 331, but the p-side electrode 111 is not bonded directly with the electrode 42 formed on the substrate for mounting 4. Therefore, load applied to the first mesa 11 in the process of mounting the light receiving element 3 on the substrate for mounting 4 may be reduced in a reliable manner.

In addition, if a recess is formed in the insulating material of the substrate for mounting 4, the first mesa 11 and the substrate for mounting 4 may be prevented from being brought into direct contact in a reliable manner, so that the load possibly applied to the first mesa 11 may be reduced in a more reliable manner.

Moreover, in this embodiment, the extractor electrode 331 of the third mesa 33 and the electrode 42 of the substrate for mounting 4 are bonded, and thereby the space around the first mesa 11 is closed by the third mesa 33 and the substrate for mounting 4.

In this way, intrusion of water towards the first mesa 11 may be prevented in a reliable manner, and thereby long-term reliability of the light receiving element 3 may be improved in a reliable manner.

The height-wise dimension H3 of the third mesa 33 is larger than the height-wise dimension H1 of the first mesa 11, so that the substrate for mounting 4 may be brought into contact only with the third mesa 33, without being brought into contact with the first mesa 11, even if the substrate for mounting 4 should be disposed as being inclined with respect to the semiconductor substrate 101 of the light receiving element 3.

By virtue of this configuration, the first mesa 11 is more reliably prevented from being concentrated with load.

Third Embodiment

A semiconductor optical element of this embodiment will be explained referring to FIG. 8 to FIG. 10.

The semiconductor optical element was a light receiving element in each of the above-described embodiments, whereas it is a semiconductor light emitting element in this embodiment.

Figure 8:
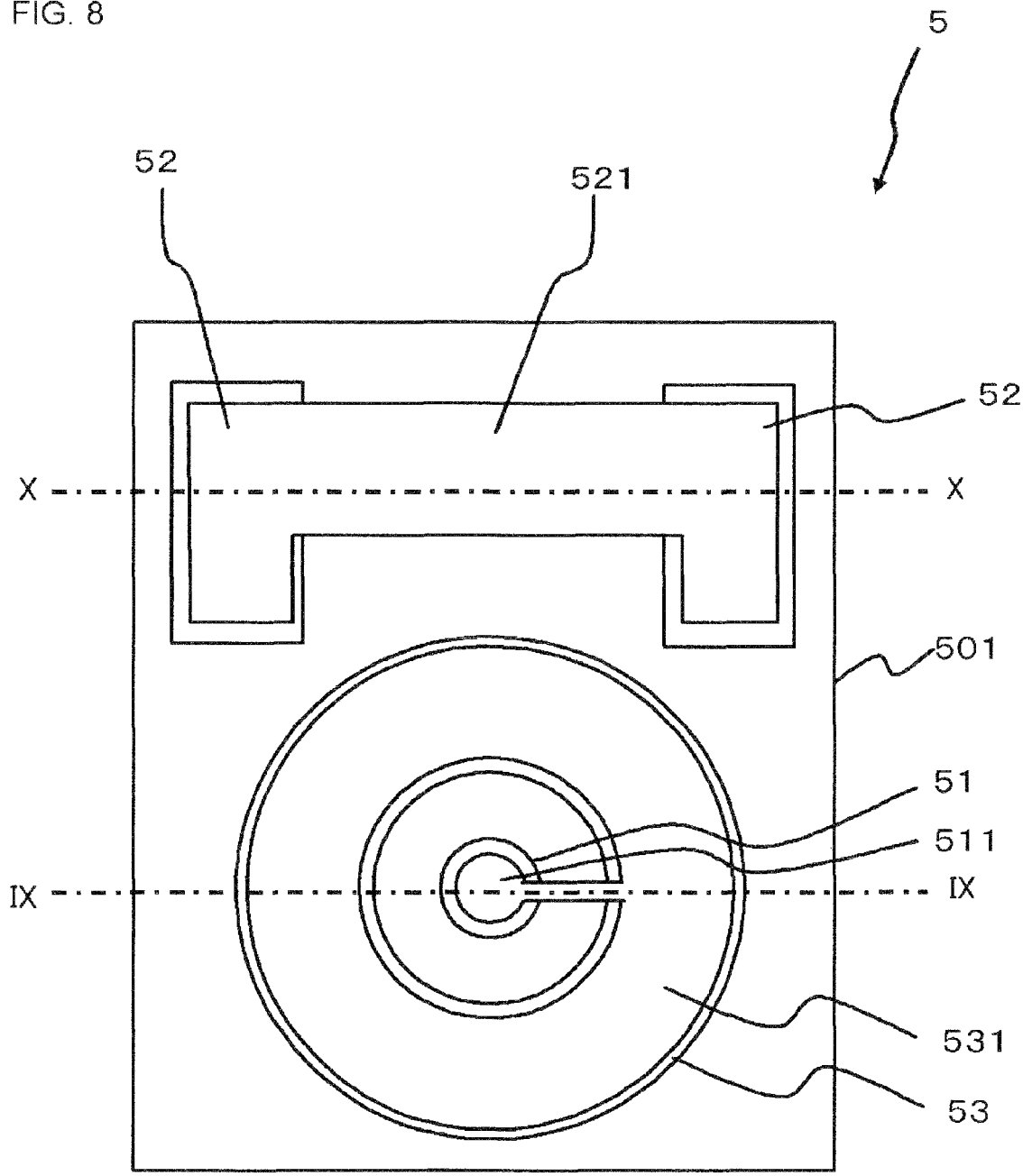
FIG. 8 is a plan view showing a light emitting element according to a third embodiment.
Figure 9:
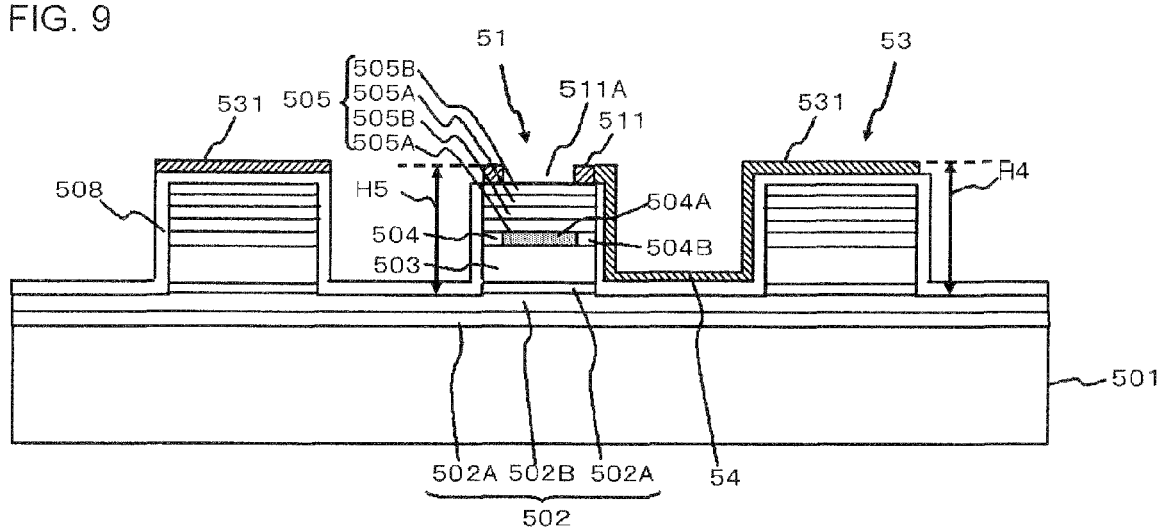
FIG. 9 is a drawing taken along direction IX-IX in FIG. 8.

FIG. 8 is a plan view of a light emitting element 5 of this embodiment, and FIG. 9 is a sectional view taken along direction IX-IX in FIG. 8. FIG. 10 is a sectional view taken along direction X-X in FIG. 8.

The light emitting element 5 is a surface emission semiconductor laser element of vertical oscillator type, and has a semiconductor substrate 501, and a semiconductor layer provided over the semiconductor substrate 501.

The semiconductor substrate 501 is typically an n-type GaAs substrate.

Figure 10:
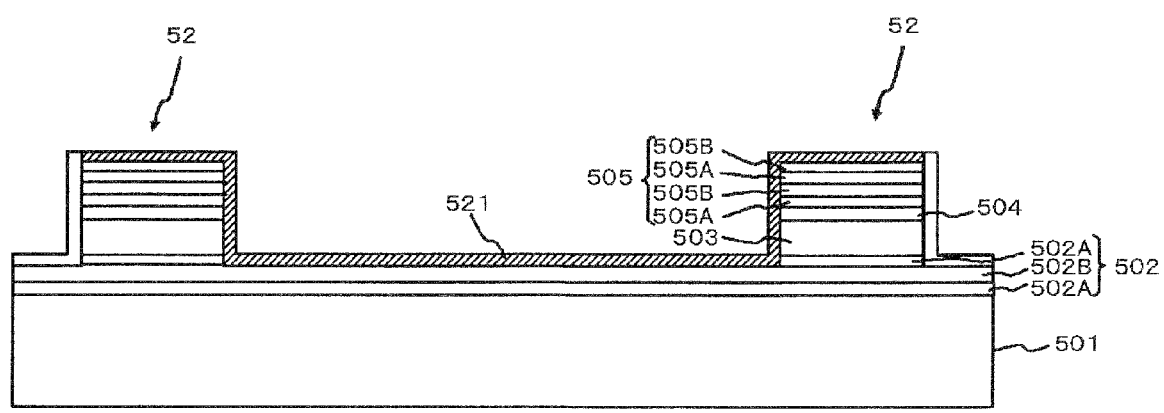
FIG. 10 is a sectional view taken along direction X-X in FIG. 8.

As shown in FIGS. 9, 10, the semiconductor layer is composed of an n-side, multi-layered reflective film 502, an active layer (light emitting layer, active region) 503, a current confining layer 504, a p-side, multi-layered reflective film 505, and an unillustrated cap layer stacked in this order over the semiconductor substrate 501.

The n-side, multi-layered reflective film 502 is composed of an n-type semiconductor multi-layered film, and is typically a DBR (distributed Bragg reflector) mirror having n-type AlGaAs films 502A and n-type GaAs films 502B stacked alternatively.

The active layer 503 is stacked over the n-side, multi-layered reflective film 502, and is configured by a multi-layered structure typically containing an MQW (multiple quantum well) which is composed of undoped InGaAsN well layers and barrier layers.

The current confining layer 504 is typically an $Al_{0.98}Ga_{0.02}As$ layer. The current confining layer 504 in the first mesa 51 has a low-resistivity region 504A formed therein. The low-resistivity region 504A is formed as being held between high-resistivity region 504B having a resistivity value larger than that of the low-resistivity region 504A, and is formed by a steam oxidation step. The low-resistivity region 504A serves as an output port of light through which the light from the active layer 503 is emitted.

The p-side, multi-layered reflective film 505 is, for example, a DBR mirror having p-type AlGaAs films 505A and p-type GaAs films 505B alternatively stacked therein.

Over the semiconductor substrate 501 of thus-configured light emitting element 5, a plurality of mesas (first mesa 51, second mesas 52, and third mesa 53) having the individual layers 502 to 505 are provided.

The individual mesas 51 to 53 are formed by stacking and then etching the individual layers 502 to 505.

The first mesa 51 is formed in a near-cylindrical shape.

The first mesa 51 has the individual layers 502 to 505, a cap layer (not shown), and a p-side electrode (first electrode) 511 provided over the cap layer. The p-side electrode 511 has an opening 511A formed at the center thereof, in which the cap layer (not shown) is exposed. The opening 511A serves as an output port of light.

The width-wise dimension of the first mesa 51 (the width-wise dimension as viewed in the direction normal to the direction of projection of the first mesa 51, which is the diameter of the first mesa 51 herein) is 20 μm or smaller, for example.

As shown in FIG. 10, there are provided a plurality of (two in this embodiment) second mesas 52, each having a shape of rectangular prism. The second mesas 52 are formed at positions a predetermined distance away from the first mesa 51.

Two these second mesas 52 are arranged as being opposed.

Over the cap layer (not shown) of the individual second mesas 52, and over the GaAs film 502B between the individual second mesas 12, an n-side electrode 521 is formed. The n-side electrode 521 is composed of a step-conforming interconnect.

Area of the top of each second mesa 52 is larger than area of the top of the first mesa 51.

The second mesas 52 and the first mesa 51 are connected through the GaAs films 502B and the AlGaAs films 502A, which are electro-conductive layers.

The third mesa 53 is formed in a ring shape so as to surround the first mesa 51. The shape and position of arrangement of the third mesa 53 are same with those of the third mesa in the above-described embodiments.

The third mesa 53 has an extractor electrode 531 on the top thereof. The extractor electrode 531 which is the top of the third mesa 53 and the p-side electrode 511 of the first mesa 51 are connected through an interconnect 54. The interconnect 54 is provided so as to extend over the protective film 508 covering the sidewall of the first mesa 51, over the protective film 508 on the GaAs film 505B between the first mesa 51 and the third mesa 53, and over the protective film 508 covering the sidewall of the third mesa 53.

In this embodiment, the height-wise dimensions of the first mesa 51 and the second mesas 52 are nearly equal, and height-wise dimension H4 of the third mesa 53 is higher than the height-wise dimension H5 of the first mesa 51.

Thus-configured light emitting element 5 is mounted on the substrate for mounting 4 similar to that described in the second embodiment. In other words, the resultant structure is such that the electrode 42 formed on the substrate for mounting 4 and the extractor electrode 531 are brought into contact, and the electrode 21 formed on the substrate for mounting 4 and the n-side electrode 521 are brought into contact, but the p-side electrode 511 is not brought into contact with the electrode 42 formed on the substrate for mounting 4.

The substrate of the substrate for mounting 4 may be configured for example by a Si substrate allowing therethrough transmission of light having a wavelength of the light emitting element 5, typically 1.31 μm. This configuration allows transmission of light coming from the light emitting element 5. Lens or the like may be fabricated on the substrate for mounting 4 in a region allowing therethrough transmission of light (a region where a hole 421 of the electrode 42 was formed).

Thus-configured light emitting element 5 operates as follows.

Upon application of voltage between the n-side electrode 521 and the p-side electrode 511, current is injected from the p-side electrode 511, through the cap layer (not shown), an etching stopper layer 506, the p-side, multi-layered reflective film 505, and the current confining layer 504, into the active layer 503. The current is injected also from the n-side electrode 521 through the n-side, multi-layered reflective film 502 into the active layer 503. Light generates in the active layer 503, and is then emitted through the low-resistivity region of the current confining layer 504, the p-side, multi-layered reflective film 505, the etching stopper layer 506 and the cap layer, out from the opening 511A formed in the p-side electrode 511.

Next, a method of manufacturing the light emitting element 5 will be explained below.

Over the semiconductor substrate 501, the n-side, multi-layered reflective film 502, the active layer (active region) 503, the current confining layer 504, the p-side, multi-layered reflective film 505, and the cap layer (not shown) are sequentially stacked by MBE (molecular beam epitaxy) using gas sources.

Next, the individual layers layer 502 to 505, and the cap layer (not shown) are selectively removed by etching, to thereby form the first mesa 51, the second mesas 52, and the third mesa 53.

Next, the substrate having mesas formed thereon is placed in a furnace introduced with steam under a high temperature environment at around 450° C., so as to allow steam oxidation to proceed.

By this process, only the current confining layer 504 having a large Al content is selectively oxidized from the peripheral portion towards the center portion thereof. By the steam oxidation for a predetermined duration of time, the current confining layer 504 in the first mesa 51 will have formed therein the low-resistivity region 504A at the center thereof, and the high-resistivity 504B region around the low-resistivity region 504A.

The protective film 508 is further formed, similarly to as in the second embodiment, a part of the protective film 508 is then removed, and the n-side electrode 521, the p-side electrode 511, the extractor electrode 531, and the interconnect 54 are formed by known procedures.

Thereafter, the opening 511A is formed by etching at the center of the p-side electrode 511.

The light receiving element 5 may be completed in this way.

According to this embodiment, not only the effects almost similar to those in the second embodiment may be expressed, but also the effects below may be expressed.

The width of the first mesa 51 of the light emitting element 5 is smaller than the width of the first mesa 11 of the light receiving elements 1, 3. The first mesa 51 may, therefore, have only a relatively low strength. Provision of the annular third mesa 53 as in this embodiment, so as to avoid direct contact between the first mesa 51 and the substrate for mounting 4, may therefore protect the first mesa 51, and may thereby improve reliability of the light emitting element 5.

It is to be understood that the present invention is by no means limited to the above-described embodiments, instead including any modifications and improvements within the scope in which the object of the present invention may be attainable.

Figure 11:
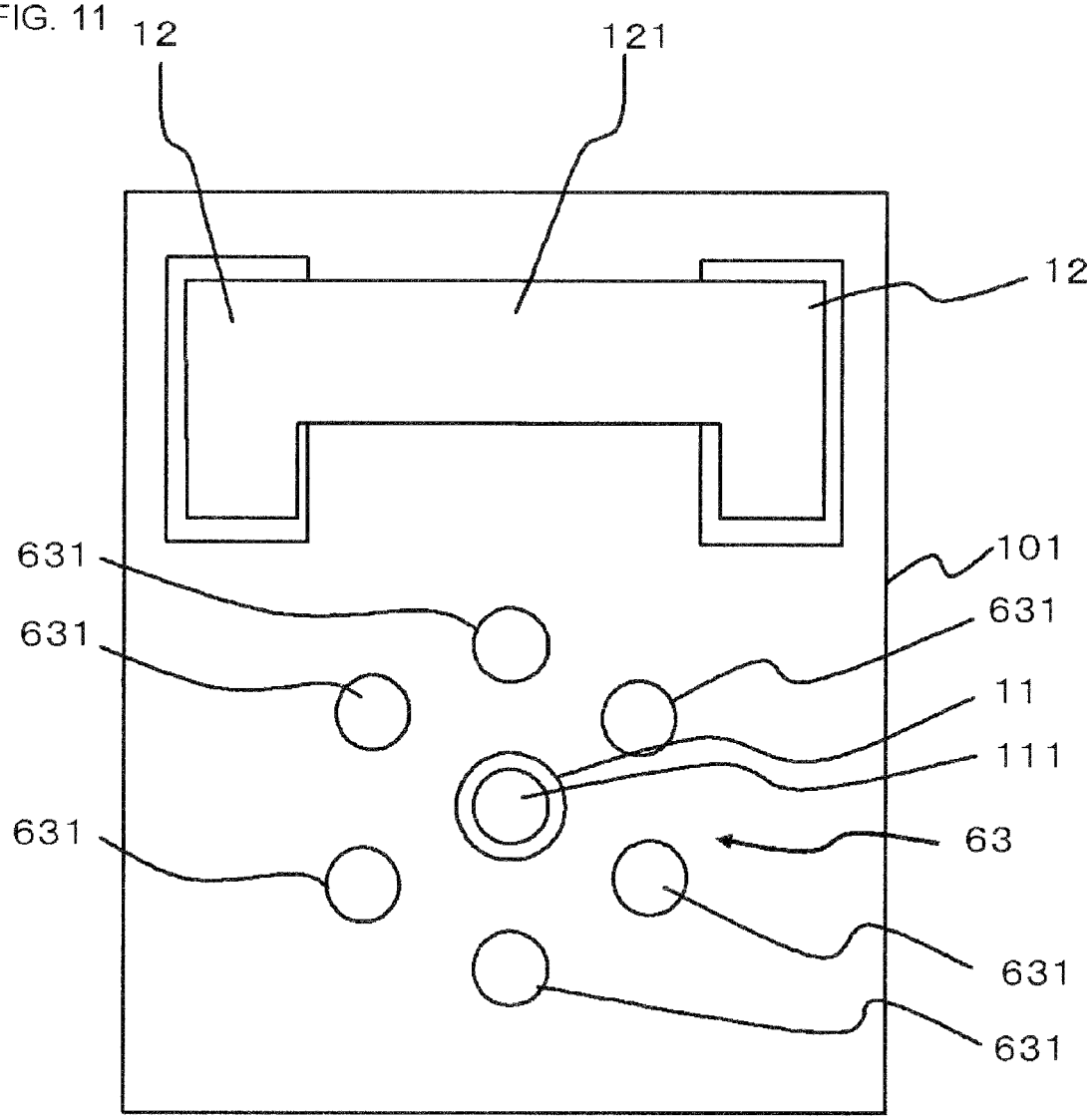
FIG. 11 is a plan view showing a modified example of the present invention.

For example, although the third mesa in the individual embodiments was formed in a ring shape surrounding the first mesa, another possible case is such as shown in FIG. 11, wherein a third mesa 63 may be composed of a plurality of mesa components 631, and the plurality of mesa components 631 may surround the periphery of the first mesa 11.

It is, however, more preferable to adjust the gap between the mesa components only to a degree enough for preventing water from intruding, for the case where the third mesa is expected to prevent intrusion of water. More specifically, for the case where it is intended to prevent intrusion of water by the third mesa, the third mesa is preferably formed in an annular shape having a slit in a part thereof, only to as wide as allowing prevention of intrusion of water.

The expression of "the plurality of mesa components 631 may surround the periphery of the first mesa 11" herein means that it is good enough that the first mesa may have the center thereof fallen, in the plan view, in a region surrounded by the plurality of mesa components 631.

For example, even for the case where there are only three mesa components 631 as shown in FIG. 12(A), or only two mesa components 631 as shown in FIG. 12(B), it is good enough that the first mesa may 11 have the center C thereof fallen, in the plan view, in a region A surrounded by the plurality of mesa components 631.

If the center C in the plan view of the first mesa 11 falls in the region A surrounded by the plurality of mesa components 631 as described in the above, inclination of the substrate for mounting at least in two directions (for example, inclination of the substrate for mounting in the direction towards one mesa component 631 in FIG. 12(B), and inclination of the substrate for mounting in the direction towards the other mesa component 631) is affordable.

It is, however, more preferable that the first mesa 11 is contained in the region surrounded by the plurality of mesa components 631, without swelling out therefrom, as shown in FIG. 11 and FIG. 12(A).

By this configuration, inclination of the substrate for mounting in various directions may be affordable in a more reliable manner. Also intrusion of water towards the first mesa 11 side from various directions may be suppressed.

Figure 13:
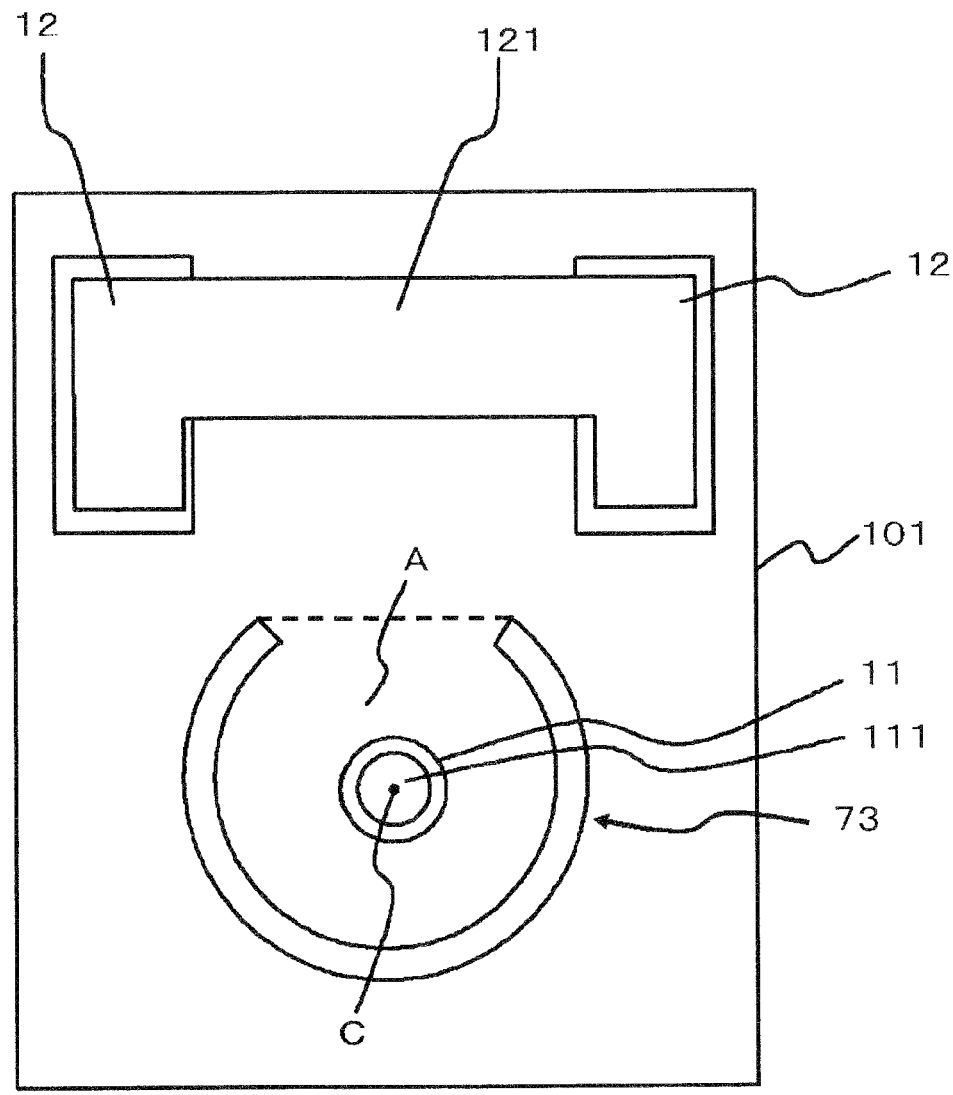
FIG. 13 is a plan view showing a modified example of the present invention.

Alternatively, the plan geometry of a third mesa 73 may be near-C shape in the plan view, as shown in FIG. 13.

For the case where the third mesa 73 is formed in a near-C shape in the plan view, the third mesa 73 necessarily surrounds the first mesa 11 over a range exceeding a half of the outer circumference of the first mesa 11. In other words, it is good enough that the center C of the first mesa 11 in the plan view may fall in the region A surrounded by the third mesa 73.

If the center C in the plan view of the first mesa 11 falls in the region A surrounded by the third mesa 73, inclination of the substrate for mounting at least in two directions (for example, inclination of the substrate for mounting rightward and leftward in FIG. 13) is affordable.

Again in this case, the first mesa 11 is preferably contained in the region A surrounded by the third mesa 73.

Alternatively, the third mesa may be arranged so as to surround not only the first mesas 11, 51, but also the periphery of the first mesas 11, 51 and the second mesas 12, 52.

Formation of the third mesa so as to surround the periphery of the first mesas 11, 51 and the second mesas 12, 52 may, however, expand the plan geometry of the third mesa, so that the third mesa is more preferably formed so as to surround only the first mesas 11, 51, as described in the above embodiments.

Although a plurality of second mesas 12, 52 were provided in the above-described embodiments, provision of only a single second mesa may be allowable.

The light receiving elements 1, 3, described as being avalanche photo diodes in the first and second embodiments, are not limited thereto, and may be arbitrary light receiving elements having the first to third mesas.

Figure 14:
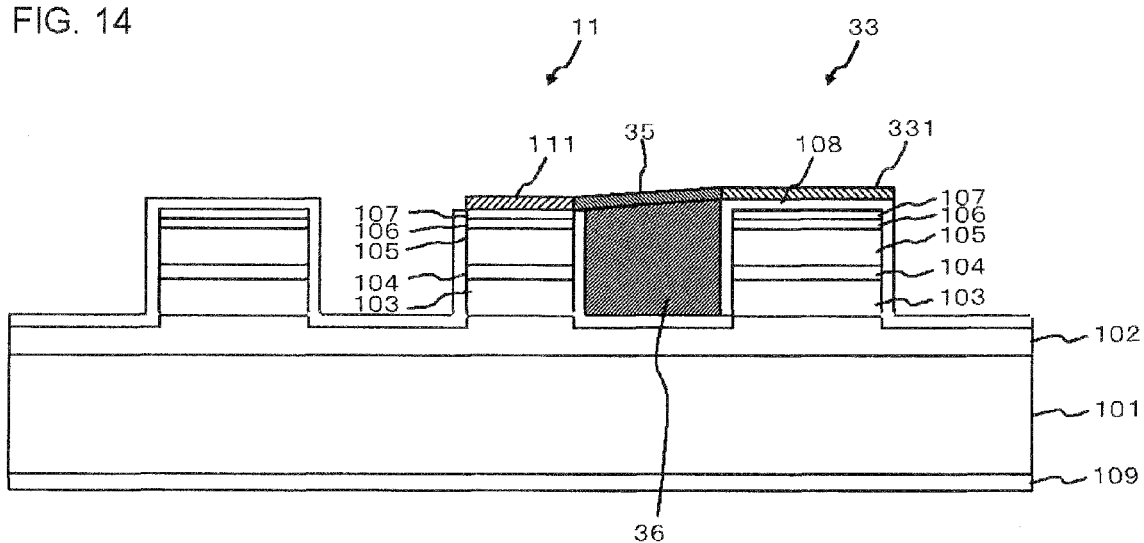
FIG. 14 is a sectional view showing a modified example of the present invention.
Figure 15:
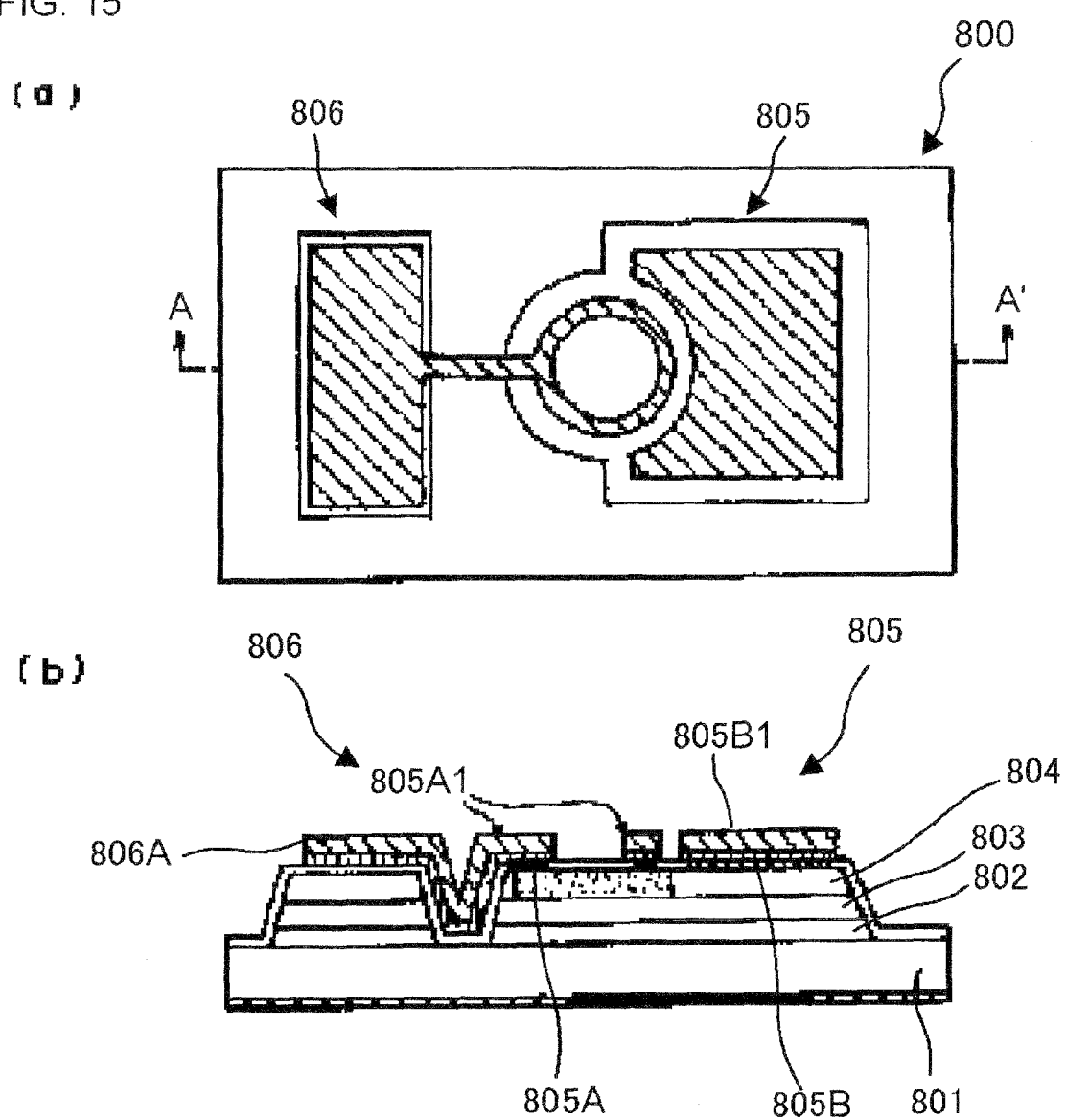
FIG. 15 is a drawing showing a conventional light emitting element.
Figure 16:
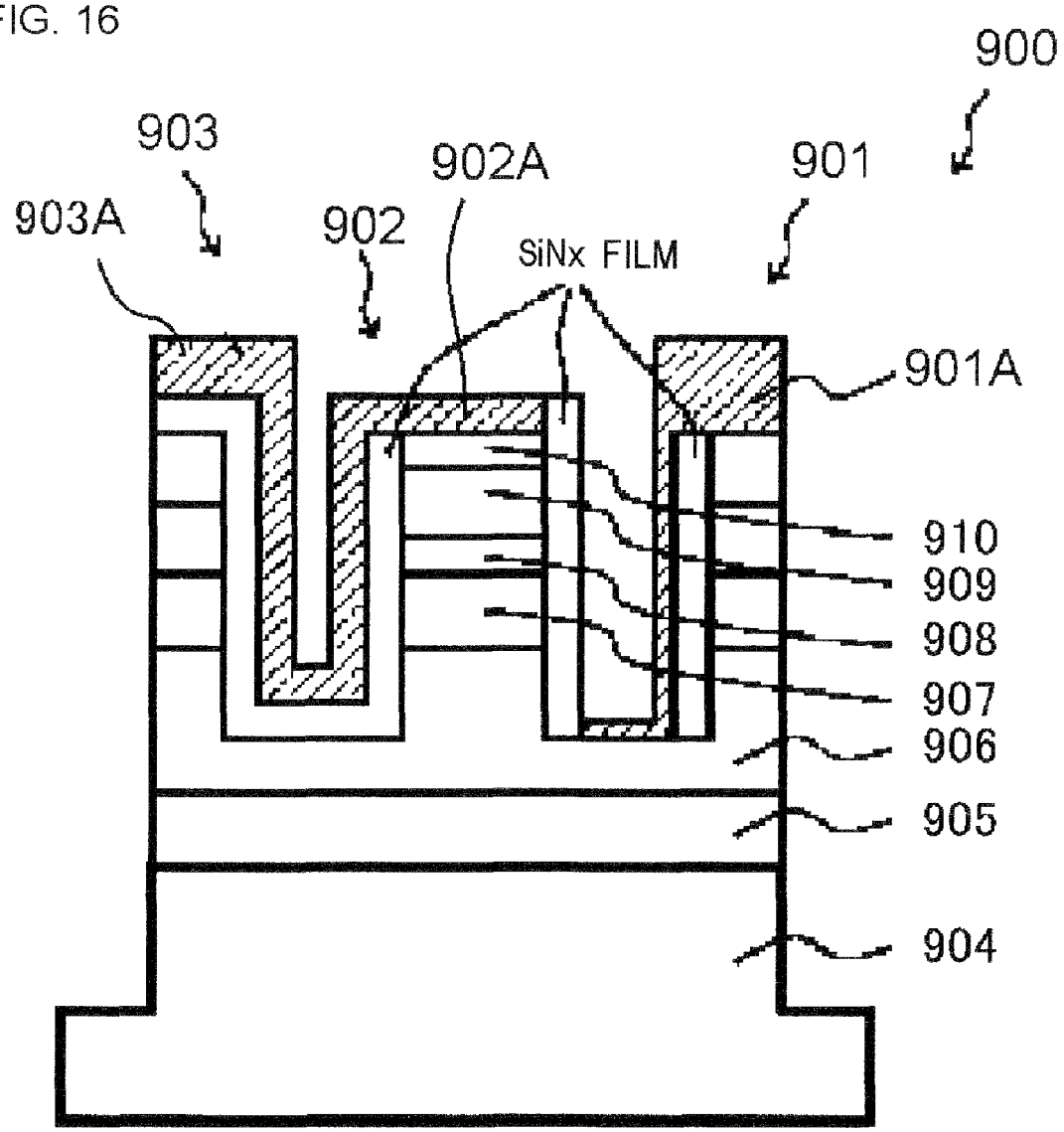
FIG. 16 is a sectional view showing a conventional light emitting element.

Still alternatively, the extractor interconnects 34, 54 formed, in the second and third embodiments, over the sidewalls of the first mesas 11, 51, sidewalls of the third mesas 33, 53, over the buffer layer 102 surrounded by the sidewalls of the first mesas 11, 51 and the sidewalls of the third mesas 33, 53, and over the GaAs film 502B, are not limited thereto, instead typically allowing formation of a bridge-like interconnect 35 arranged so as to stride over a gap between the first mesa 11 and the third mesa 33 as shown in FIG. 14.

In this case, it is preferable to fill an insulating film 36 under the interconnect 35.

The interconnect 35 having no insulating film 36 filled thereunder, but leaving the hollow structure, or given in a form of step-conforming interconnect may sometimes cause disconnection, in the process of manufacturing the semiconductor optical element or in the long-term use of the semiconductor element. In contrast, adoption of the structure filled with the insulating film 36 may prevent the disconnection from occurring, and may improve reliability of the semiconductor optical element.

The height-wise dimension H3 of the third mesa 33 in the second embodiment was higher than the height-wise dimension H1 of the first mesa 11, wherein the height-wise dimension of the third mesa may be equal to the height-wise dimension of the first mesa. Similarly, also in the third embodiment, the height-wise dimension of the third mesa may be set equal to the height-wise dimension of the first mesa.

What is claimed is:

1. A semiconductor optical element comprising:
    a semiconductor substrate;
    a first mesa provided over said semiconductor substrate, and having an active region and a first electrode provided over said active region;
    a second mesa provided over said semiconductor substrate, and having a semiconductor layer and a second electrode provided over said semiconductor layer; and
    a third mesa provided over said semiconductor substrate, and having a semiconductor layer,
    wherein said third mesa is formed in a ring shape so as to surround said first mesa,
    wherein each of said first, second and third mesas is spaced apart from and free of direct physical contact with each other of said first, second and third mesas.

2. The semiconductor optical element as claimed in claim 1,
    wherein a part of said third mesa locates between said first mesa and said second mesa.

3. The semiconductor optical element as claimed in claim 2, wherein height-wise dimension of said third mesa is equal to height-wise dimension of the first mesa, or larger than the height-wise dimension of said first mesa.

4. The semiconductor optical element as claimed in claim 2,
    wherein said third mesa has an extractor electrode formed on the top thereof, and
    an interconnect connecting said first electrode on said first mesa, and said extractor electrode at the top of said third mesa is provided.

5. The semiconductor optical element as claimed in claim 2,
    wherein area of the top of said first mesa is smaller than area of the top of said second mesa.

6. The semiconductor optical element as claimed in claim 2,
    wherein said semiconductor optical element is a semiconductor light receiving element,
    said active region of said first mesa is a light absorbing layer, and
    said first mesa and said second mesa are electrically connected through an electro-conductive layer formed over said semiconductor substrate.

7. The semiconductor optical element as claimed in claim 1, wherein height-wise dimension of said third mesa is equal to height-wise dimension of the first mesa, or larger than the height-wise dimension of said first mesa.

8. The semiconductor optical element as claimed in claim 7,
wherein said third mesa has an extractor electrode formed on the top thereof, and
an interconnect connecting said first electrode on said first mesa, and said extractor electrode at the top of said third mesa is provided.

9. The semiconductor optical element as claimed in claim 7,
wherein area of the top of said first mesa is smaller than area of the top of said second mesa.

10. The semiconductor optical element as claimed in claim 7,
wherein said semiconductor optical element is a semiconductor light receiving element,
said active region of said first mesa is a light absorbing layer, and
said first mesa and said second mesa are electrically connected through an electro-conductive layer formed over said semiconductor substrate.

11. The semiconductor optical element as claimed in claim 1,
wherein said third mesa has an extractor electrode formed on the top thereof, and
an interconnect connecting said first electrode on said first mesa, and said extractor electrode at the top of said third mesa is provided.

12. The semiconductor optical element as claimed in claim 11,
wherein said interconnect is arranged so as to stride over a gap between said first mesa and said third mesa, and
an insulating film is filled under said interconnect.

13. The semiconductor optical element as claimed in claim 12,
wherein area of the top of said first mesa is smaller than area of the top of said second mesa.

14. The semiconductor optical element as claimed in claim 12,
wherein said semiconductor optical element is a semiconductor light receiving element,
said active region of said first mesa is a light absorbing layer, and
said first mesa and said second mesa are electrically connected through an electro-conductive layer formed over said semiconductor substrate.

15. The semiconductor optical element as claimed in claim 11,
wherein area of the top of said first mesa is smaller than area of the top of said second mesa.

16. The semiconductor optical element as claimed in claim 11,
wherein said semiconductor optical element is a semiconductor light receiving element,
said active region of said first mesa is a light absorbing layer, and
said first mesa and said second mesa are electrically connected through an electro-conductive layer formed over said semiconductor substrate.

17. The semiconductor optical element as claimed in claim 1,
wherein area of the top of said first mesa is smaller than area of the top of said second mesa.

18. The semiconductor optical element as claimed in claim 1,
wherein said semiconductor optical element is a semiconductor light receiving element,
said active region of said first mesa is a light absorbing layer, and
said first mesa and said second mesa are electrically connected through an electro-conductive layer formed over said semiconductor substrate.

19. The semiconductor optical element as claimed in claim 1,
wherein said semiconductor optical element is a semiconductor light emitting element, and
said active region of said first mesa is a light emitting layer.

20. The semiconductor optical element as claimed in claim 1,
wherein said semiconductor optical element is mounted face-down on a substrate for mounting so that the tops of said first, second and third mesas are facing towards said substrate for mounting.

* * * * *